United States Patent [19]
Löw

[11] Patent Number: 5,212,690
[45] Date of Patent: May 18, 1993

[54] METHOD OF SYNCHRONIZING DIGITAL DATA BY COMPARING TO A REFERENCE WORD TO DETERMINE BIT ERRORS

[75] Inventor: Andreas Löw, Gross-Gerau, Fed. Rep. of Germany

[73] Assignee: BTS Broadcast Television Systems GmbH, Darmstadt, Fed. Rep. of Germany

[21] Appl. No.: 742,670

[22] Filed: Aug. 7, 1991

[30] Foreign Application Priority Data

Aug. 29, 1990 [DE] Fed. Rep. of Germany ....... 4027262

[51] Int. Cl.⁵ ............................................. H04J 3/06
[52] U.S. Cl. .................... 370/108; 375/114; 371/42
[58] Field of Search ............. 370/108, 100.1, 105.4; 371/42, 46, 47.1, 67.1, 68.1; 375/106, 112, 108, 114, 116

[56] References Cited

U.S. PATENT DOCUMENTS

| | | | |
|---|---|---|---|
| 4,686,690 | 8/1987 | Sato | 371/47.1 |
| 5,054,035 | 10/1991 | Tarallo et al. | 375/114 |
| 5,084,891 | 1/1992 | Ariyavisitakul et al. | 371/42 |
| 5,123,020 | 6/1992 | Yoshimura et al. | 371/68.1 |

*Primary Examiner*—Douglas W. Olms
*Assistant Examiner*—Shick Hom
*Attorney, Agent, or Firm*—Sprung Horn Kramer & Woods

[57] ABSTRACT

A method of synchronizing digital data which includes periodic synchronization sequences. The first step in the method comprises determining the number of bit errors in relation to an ideal bit sequence in the synchronization sequence. A next step comprises using twice the chronological filtration from the resulting bit-error values to determine the timing of a synchronization sequence recognized in the digital data, allowing the data to be assembled block by block.

12 Claims, 4 Drawing Sheets

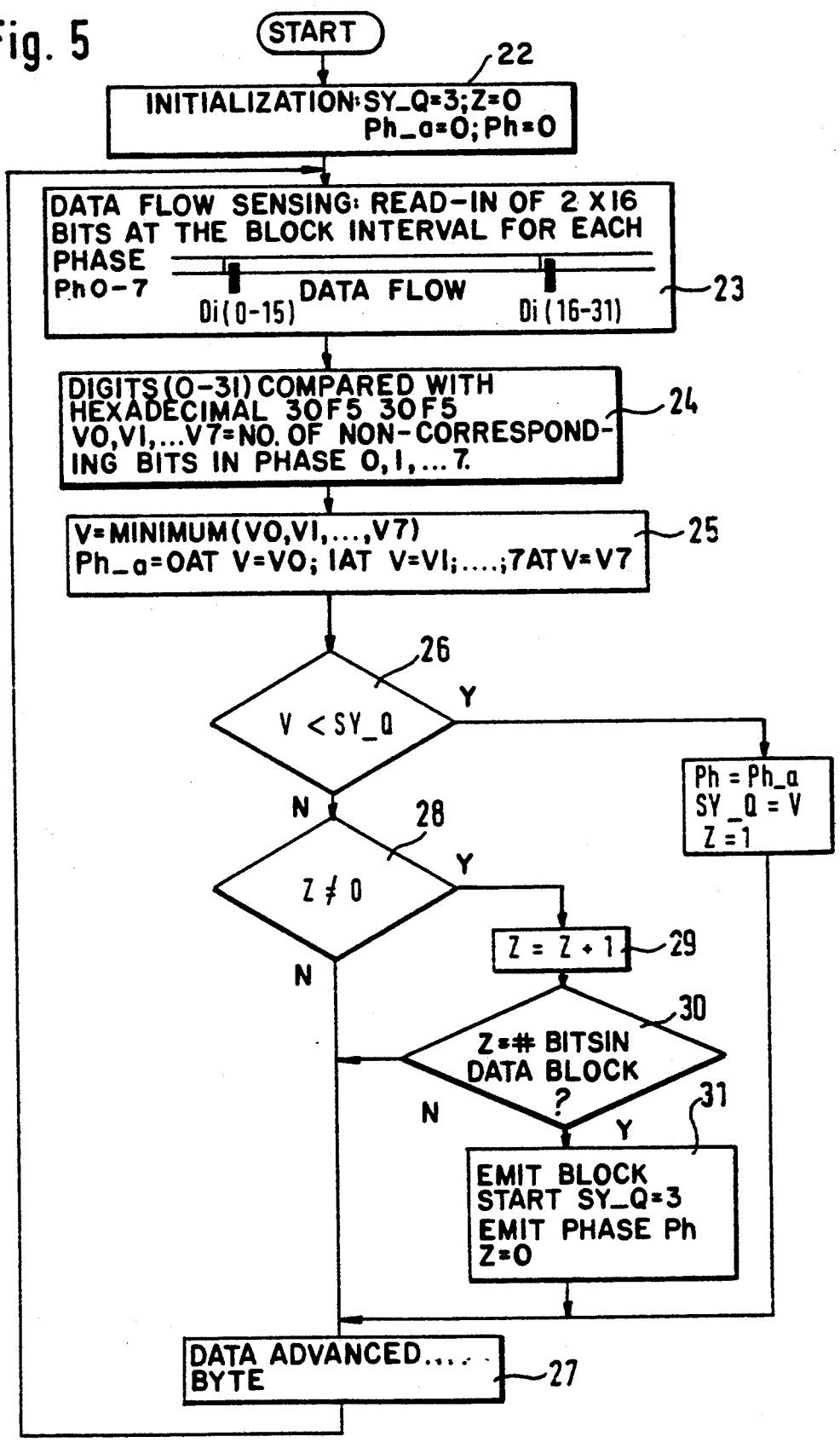

METHOD OF SYNCHRONIZING DIGITAL DATA BY COMPARING TO A REFERENCE WORD TO DETERMINE BIT ERRORS

BACKGROUND OF THE INVENTION

The present invention relates to a method of synchronizing digital data during a serial-to-parallel conversion of such data. More particularly, the invention relates to a method of synchronizing digital data which is separated into data blocks, each of which comprises a group of data words and one or more synchronization words. A bit-synchronous timing or clock signal CLK is generated from the serial data stream and a word-timing signal is derived with a frequency equalling the sequential frequency of the serial words.

The German Patent No. 3 225 365 C2 discloses a method of converting serial data signals into parallel form. The signals comprise data words and synchronization words, each consisting of a number of bits. From these can be derived a timing signal $T_w$ with a frequency that equals the sequential frequency of the data words. The timing signal is employed for serial-to-parallel conversion. Since the timing signal is not specifically related chronologically to the beginnings or ends of the data words or synchronization words, the parallel data signals are initially stored in a buffer. A combinatorial circuit comprising several comparators then detects by how many bit periods the chronology of the data signals in relation to the timing signal deviates from what it should be. The parallel data signals are then obtained from the buffer in accordance with the detected deviation such that the bits belonging to each data word are simultaneously present in a prescribed distribution in the parallel signal lines.

The German Patent No. 3 718 566 A1 discloses a method of playing back data stored on magnetic tape. Serial signals detected by a playback head are initially converted from serial to parallel form without synchronizing the words, and the parallel signals are delayed one data block. The undelayed parallel signals are forwarded to a synchronization detector, and both the undelayed and the delayed parallel signals are supplied to a multiple-switching device. The synchronization detector generates synchronization information specifying by how many timing periods the serial-to-parallel conversion deviates from word-synchronized serial-to-parallel conversion when data information and word synchronization are recognized as identical. The synchronization information is stored in a register and utilized to control the multiple-switching device.

The publication "Standard of Recording Digital Television Signals on Magnetic Tape in Cassettes", of the European Broadcasting Union (EBU), Tech. 3252-E, describes synchronizing with the 16-bit hexadecimal synchronization word 30F5 ($0011000011110101_{bin}$). When the approach described in the German Patent No. 3 718 566 A1 is employed, two such 30F5's must be detected one data block apart for the data bits between the synchronization words to be emitted in the capacity of a block to use for further data processing. When, however, a data signal recorded in accordance with the aforesaid EBU standard exhibits a higher rate of error during playback, the prescribed synchronization-bit sequence of 30F5's will be contaminated by bit errors, and detection of the synchronization words in the reproduced data signal will fail even when there is a correctable data block between the contaminated synchronization words.

Synchronization can be improved, for example, by allowing a defective bit in the synchronization-bit sequence of the 16-bit synchronization word 30F5. One bit error per synchronization word would accordingly no longer affect synchronization, and the improved yield of data blocks would on the whole be expected to lead to a lower error rate. Such an approach would also, of course, increase the probability of faulty synchronization due to faulty-synchronization words in the flow of the played-back data signal. Instead of one word, 16 additional words can be taken for synchronization words. Although the synchronization words must occur an exact distance from the data blocks, thus reducing the potential for faulty synchronization, certain image patterns can lead to increased faulty synchronization values.

SUMMARY OF THE INVENTION

Accordingly, the principal object of the present invention is to provide a method of the aforesaid type that will reliably recognize synchronization words in the data signal and decrease the probability of faulty synchronization.

This object, as well as other objects which will become apparent in the discussion that follows, are achieved, in accordance with the present invention, by comparing the bit sequence of the digital data with an ideal bit sequence in the synchronization sequence to detect the number of bit errors in relation to the reference bit sequence in the synchronization sequence; adding the detected value of the bit errors to the value of the bit errors detected in the interval of the ideal bit sequence in the synchronization sequence; temporarily storing the resulting sum in a buffer when it is lower than a sum previously deposited in the buffer, such that the time when the sum is temporarily stored dictates the temporal situation of a pulse included in the signal that characterizes the situation of the synchronization sequence and, subsequent to processing a number of data corresponding to the periodic interval of the ideal bit sequence in synchronization, leads to erasure of the buffer when no smaller sum has appeared; and delaying the digital data for equalization of signal periods by the processing procedure by twice the duration of the periodic interval of the synchronization sequences.

One advantage of the method according to the present invention is that the quality of precisely the current synchronization can be evaluated in accordance with the number of bits that do not match during synchronization recognition. One synchronization of high quality will accordingly establish a temporal window for the next synchronization. This window can be corrected only by even better synchronization-word recognition. In contrast to the aforesaid prior art, accordingly, it makes no difference how many bit errors are permissible during synchronization. The sequence of bits immediately subsequent to the synchronization word, 30F5 for example, in the played-back data signal will be what finally determines synchronization. The probability of faulty synchronization and the yield of recognized synchronization words can be increased with no extra redundancy in the synchronization.

The further features and embodiments of the present invention allow advantageous advances on and improvements in the subject method. What is of particular advantage is that the method in accordance with the invention will allow reliable synchronization not only of a serial signal but also of a signal that has been converted from serial to parallel form and separated into data blocks, each comprising a specific number of data words preceded by synchronization words.

The preferred embodiment of the present invention will now be described with reference to the accompanying drawings.

BRIEF DESCRIPTION OF THE DRAWINGS

FIG. 5 is a flow chart detailing the sequence of events that occur in the synchronization system of in FIG. 1.

DESCRIPTION OF THE PREFERRED EMBODIMENT

Figure 1:
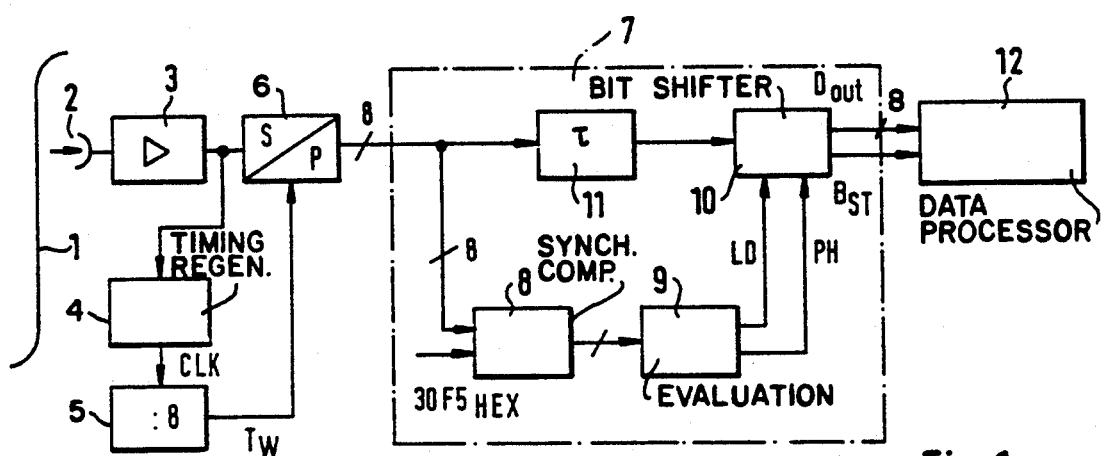
FIG. 1 is a block diagram illustrating the method in accordance with the invention in relation to the serial-to-parallel conversion of data signals.

Referring to FIG. 1, it is assumed that data are stored in tracks that extend across a magnetic tape 1. It is also assumed that the data are divided into serial data blocks of 134 words each. Each block is preceded by two 8-bit synchronization words, which take on the value 30F5. In the playback mode, the tape is scanned by several rotating heads For simplicity's sake only one playback head 2 is shown. The signal emitted from head 2 is preamplified and corrected in a stage 3, producing a serial digital signal at its output terminal. From this signal a regenerator 4 derives a timing signal CLK, which has a frequency matching the bit-sequence frequency in the serial data signal. The frequency of timing signal CLK is divided by eight in a frequency divider 5 to obtain a word-timing signal $T_W$. Note that there is no chronological relationship between word-timing signal $T_W$ and the data words in the played-back data signal. Serial-to-parallel conversion of the data signal emitted from stage 3 by means of word-timing signal $T_W$ will accordingly likewise lead to an unknown chronological relationship with respect to the exact beginnings of the words of data present in parallel form at the output terminal of a serial-to-parallel converter 6. The conversion is accordingly asynchronous serial-to-parallel conversion. To restore the chronological relationship, the parallel data signal available at the output terminal of serial-to-parallel converter 6 is forwarded to a synchronization detector 7, where the method in accordance with the invention is applied.

Synchronization detector 7 includes a comparator 8 that compares the bit-parallel data signal with the aforesaid 30F5 in a particular procedure that will be described with reference to FIGS. 3 and 4. Recognition of a synchronization word or pseudosynchronization data word is accompanied in a downstream evaluation circuit 9 by chronological filtering and evaluation of the quality of the recognized synchronization information. At the output terminal of evaluation circuit 9 are a charging pulse signal LD and a phase signal PH, which characterize the discrepancy between the attempted chronological relationship and the phasing of the recognized synchronization word. These two signals control a bit shifter 10. The bit-parallel data signal is forwarded for correction to the bit shifter by way of a delay stage 11. The output terminal of bit shifter 10 is connected by eight parallel lines to a data processor 12, which assumes further processing of the played-back data signals. The validity of the now synchronized data words in one data block is announced by a block-start signal $B_{ST}$ that arrives at data processor 12 from bit shifter 10 by way of another line.

Figure 2A:
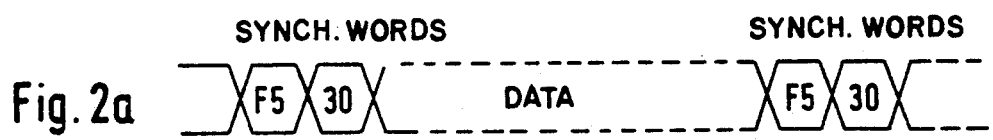
FIGS. 2a and 2b are timing diagrams illustrating pulses that occur in the synchronization system of FIG. 1.
Figure 2B:

FIG. 2a is a schematic representation of one block of the data signal, which is always preceded by a 16-bit synchronization word 30F5. FIG. 2b represents the chronologically related block-start signal $B_{ST}$. The absence of a pulse in the start signal will prevent the data processor 12 from accepting and processing the current bit-parallel data.

Figure 3:
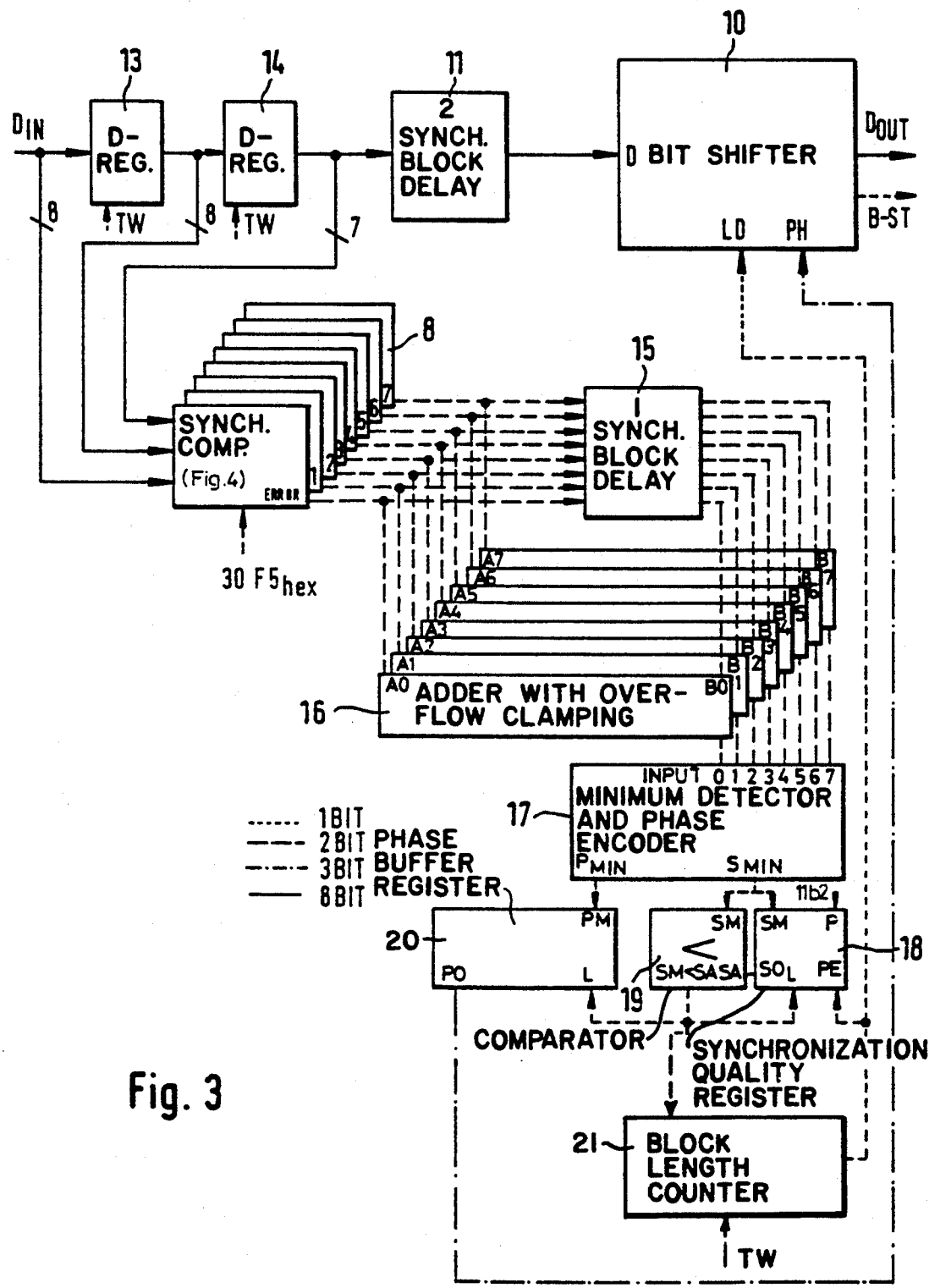
FIG. 3 is a detailed block diagram of the synchronization detector illustrated in FIG. 1.

FIG. 3 is a detailed block diagram of the synchronization detector 7 illustrated in FIG. 1. Identical components are identically labeled. The bit-parallel data signal $D_{IN}$ emitted by serial-to-parallel converter 6 is delayed two periods of timing signal CLK by two serial D registers 13 and 14. The present undelayed bit-parallel data signal $D_{IN}$ and the data signals delayed by one and by two periods are forwarded to input terminals of synchronization comparator 8, which tests eight different phasings for the presence of the 16-bit synchronization word 30F5. "Phasing" is to be understood as meaning a specific shift in bits of the word extremities in question in relation to the present word extremities. For eight-bit words, accordingly, there are eight possible phasings. In the present embodiment, 23 bits (8+8+7) in the current data signal are enough to conduct a comparison with the 16-bit synchronization word for each of the eight phasings associated with one word.

Figure 4:
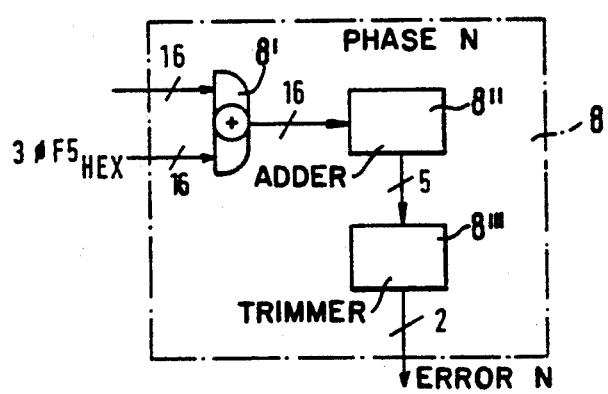
FIG. 4 is a detailed circuit diagram of the synchronization comparator illustrated in FIG. 3.

One embodiment of a synchronization-word comparator for one of the eight phasings is represented by way of example by the system illustrated in FIG. 4. Sixteen bits of the data forwarded to synchronization comparator 8 are supplied to exclusive-OR gates 8' and combined in an exclusive-OR relationship with the 16-bit 30F5. A 16-bit data signal is available at the output terminal of exclusive-OR gates 8'. A downstream adder 8" adds the 16 bits in each data word. To facilitate further signal processing, a trimmer 8''' maps the resulting horizontal sum, five bits long, onto a word that is two bits long by emitting the two low-value bits when the binary value is 00011 or less and otherwise a binary 11. The range of values is accordingly clamped, and erroneous values less than 2 are eliminated by additional testing downstream. Specific incoming lines are selected to determine the particular number of errors by which the present data value deviates from 30F5 for each of the eight phasings.

The error values discovered for each of the eight phasings are delayed the length of one data block in a delay stage 15. The undelayed error values An are added phase-separated to the delayed error values Bn in an adder 16. Here again the overflow of the sum of the addition of incoming values is clamped at the value 3. Values greater than two are ignored. One data signal Sn from adder 16 will satisfy the condition: IF (An+Bn)>3 THEN Sn=3 ELSE Sn=(An+Bn), with respect to incoming signals An and Bn. The data emitted by adder 16 are accordingly present in a word length of two bits per phasing. A minimum detector 17 employs the values emitted by adder 16 to determine the phasing with the lowest value. The minimal sum $S_{MIN}$ determined for a specific minimal phasing $P_{MIN}$ is forwarded to the input terminal SM of a register 18 and to the input terminal SM of a comparator 19. Comparator 19 tests minimal sum $S_{MIN}$ to determine whether the error value of a subsequently recognized synchronization word is lower than that of the previous one. If it is, comparator 19 emits a charging pulse L that induces register 18 to adopt the better value. The same charging pulse temporarily stores the associated minimal phasing $P_{MIN}$ in a register 20. Charging pulse L also re-zeros a block-length counter 21 that is timed by the signal CLK and emits a charging pulse signal LD upon expiration of one block period. The present block circuitry structure makes it possible for the block-length counter 21 to interrupt and re-initiate counting when a synchronization word that is similar to a previously recognized 30F5 is recognized. Since the value that dictates the phasing is simultaneously temporarily stored in register 20, the value at the output terminal PO of register 20 represents the value of the discrepancy between the correct phasing of the serial-to-parallel converted data signal and the correct phasing as defined by the recognized synchronization word. The phase signal PH at the output terminal PO of register 20 is forwarded to the bit shifter 10. The bit shifter 10 is re-zeroed in accordance with the particular present value of the recognized phase deviation by one of the pulses in charging pulse signal LD, correcting the until-now current phase deviation of the parallel data signal. Simultaneously with the now correctly phased (synchronized) data $D_{OUT}$, the bit shifter will emit the aforesaid block-start signal $B_{ST}$, which differs from charging pulse signal LD only in a specific delay. The purpose of the delay stage 11 between the input terminal D of bit shifter 10 and the output terminal of register 14 is to equalize any signal delays that may occur in evaluating the synchronization words. The adoption of the phase deviation by the bit shifter 10 will be accompanied by re-initialization of register 18 by the charging pulse signal LD. The binary 11 at input terminal P will simultaneously be accommodated by corresponding activation of an input terminal PE before the synchronization-word recognition process can determine lower values in conjunction with chronological filtering on the part of delay stage 15 and with adder 16 for comparator 19 to relate to.

The flow chart in FIG. 5 illustrates in greater detail how the synchronization detector 7 illustrated in FIG. 3 operates. The commencement of synchronization-word evaluation is followed by an initialization stage 22, in which register 18 is set to 3, block-length counter 21 to 0, the value for the current phase in minimum detector 17 to 0 and the value for the phase in register 20 to 0. Testing of the data flow commences with a subsequent stage 23, whereby twice 16 bits are initially read into the block separation for each phase. In stage 24, the number V0, V1, ..., V7 of the bits in phase 0, 1, ..., 7 that do not correspond to the sequence of bits in the reference synchronization word is determined by comparing all the present data bits Di (0–31) with the values $30F5_{hex}$ and $30F5_{hex}$ of the reference synchronization word. The V0, V1, ..., V7 with the lowest value is determined in minimum-detection stage 25. A numerical value characterizing the phasing of the minimal value is accordingly assigned to current phase Ph_a. If, for example, phase 0 has the lowest value, current phase Ph_a is set at zero. A subsequent conditional stage 26 determines whether minimum V is lower than the value in register 18, which now determines the quality of the current synchronization. If it is, register 20 will adopt actual phasing Ph_a, register 18 will accept the detected minimum, which now represents the current improved synchronization quality SY_Q, and block-length counter 21 will return to 1. In stage 27 the data are forwarded on by one word, and the process of testing the data flow recommences. In the event that the condition queried at stage 26 turns out negative, a test is carried out at a stage 28 to determine whether the state of block-length counter 21 is not zero. If the result is affirmative, block-length counter 21 is increased one timer period at stage 29. Another test is conducted at a stage 30 to determine whether the numerical value Z of block-length counter 21 yet equals the 134 (bits per data block) required in the present embodiment. If block-length counter 21 has attained 134, a subsequent stage 31 occasions the mission of a block-start pulse for the block-start pulse signal, a 3 is entered in register 18, bit shifter 10 accepts the phase signal PH in register 20, and block-length counter 21 is re-set to zero. If on the other hand block-length counter 21 has not yet attained 134, synchronization-word evaluation is applied to the subsequent data words in the data flow.

When the method in accordance with the invention is employed, two double values with x bits identical with the sequence of synchronization bits will prevent resynchronization by two 16-bit words with x or less identical bits for one block length. If on the other hand two synchronization-bit sequences with more than x bits identical with the expected sequence of synchronization bits are recognized in the data-block length, new synchronization is initiated by appropriately re-setting register 20.

Although the present embodiment takes only the values X = 32, 31, 30 into consideration, the method can be applied to all x = 32, 31, ..., 1 when data signals with very high error rates are to be synchronized.

The method in accordance with the invention terminates in that the evaluation process can be interrupted only by improved synchronization. A pair (x = 32) of synchronization words recognized with no bit difference will block all further resynchronization for one data-block length.

Bit shifter 10, which exercises the multiple-switch function described in the German Patent No. 3 225 365 C2, accepts from the evaluation circuit phase values with the highest probability of including recorded synchronization words from the temporarily stored data block.

Upon completion of synchronization, register 18 will be set at the end of a data block to the maximal permissible value, 3 for example, for non-identical bits in the synchronization-word recognition process. In the present embodiment, accordingly, resynchronization can be varied only by the occurrence of synchronization-word sequences with a permissible bit-error tolerance of 2, although it will be retained for a non-recognizable sequence of synchronization bits. No flywheel for amplifying a block-starting pulse when a data block is followed by a non-recognizable synchronization-bit sequence is needed in accordance with the present invention because of its improved synchronization-word recognition.

Faulty synchronization is to be expected only when synchronization-word sequences contaminated by bit errors are accompanied in the data flow by data-bit sequences that more nearly approximate the 30F5 in the synchronization-bit sequence. Since the probability of faulty synchronization is the product of the two individual probabilities, the probability of faulty synchronization decreases even though the yield of "genuine" synchronization words increases. The variable of high bit tolerance in the synchronization circuitry means not only that synchronization words contaminated with bit errors will also be recognized but that, when the synchronization words are correct, faulty synchronization will be prevented by synchronization words in the data flow. Even when synchronization sequences with one bit error are recognized, only two completely identical double synchronization words can occasion faulty synchronization.

Error recognition can not only be improved by using the method in accordance with the invention without accommodating extra redundancy in the data signal, but even made more reliable. At an error rate of $10^{-4}$ for example, only 0.0005% of the pairs of synchronization words in the data signal were not detected. At an error rate of $10^{-3}$ it was impossible to detect 0.0002% and at an error rate of $10^{-2}$ it was impossible to detect 0.4% of pairs of synchronization words.

The method in accordance with the invention has been described herein in its embodiment of serial-to-parallel conversion of a data signal by way of example. The same method, however, can naturally be employed with equal success for synchronizing data sequences present in serial form. In this event there will be no serial-to-parallel conversion. The data, present in the form of bits, will be initially temporarily stored with no corresponding chronological relationship. A signal including, for example, a starting pulse that characterizes the commencement of a recognized synchronization sequence is assigned to the temporarily stored data as they are read out.

Figure 6:
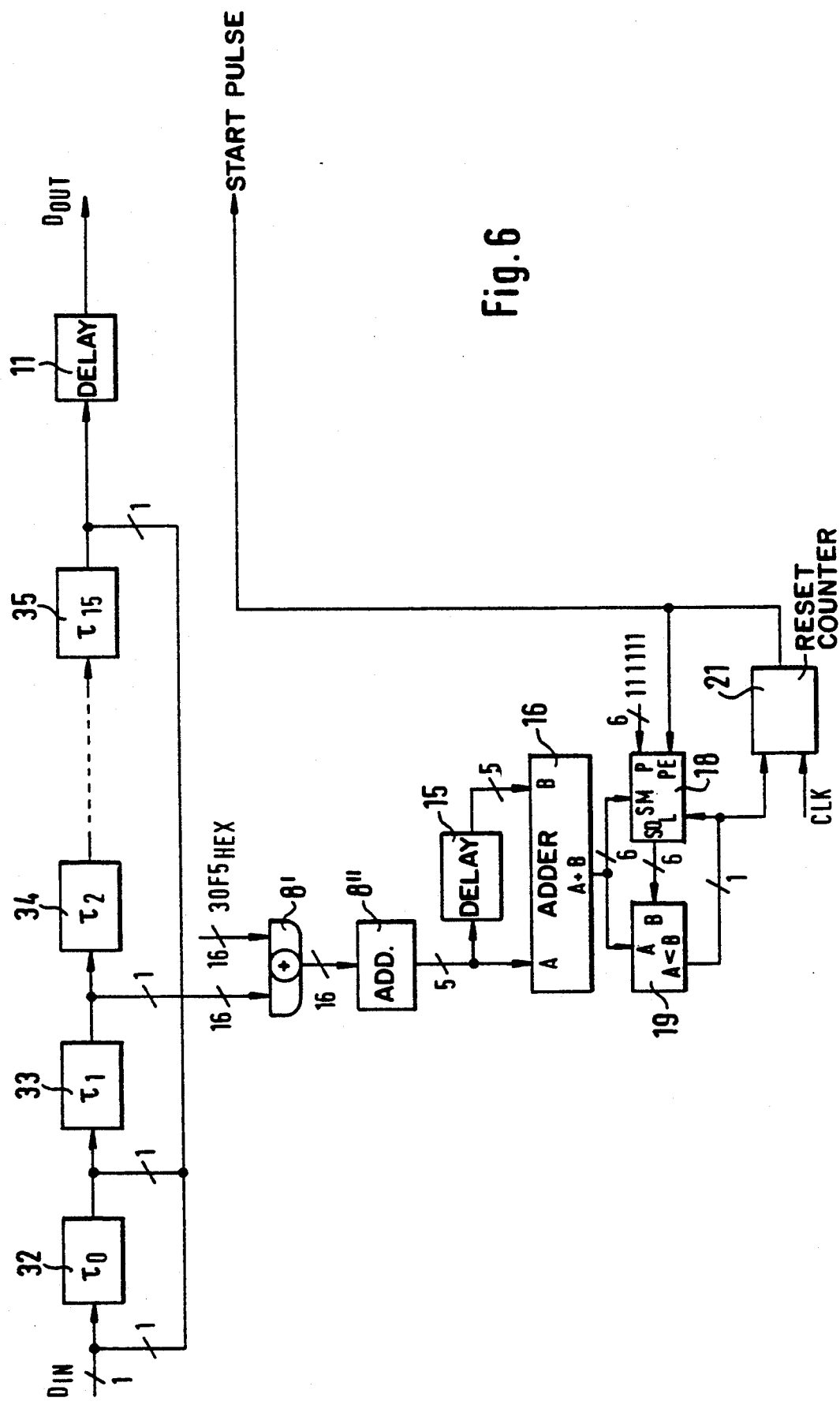
FIG. 6 is a block diagram illustrating the method in accordance with the invention with respect to synchronizing digital data.

As will be evident from the block diagram in FIG. 6, a serial data signal $D_{IN}$ is delayed 16 timing periods in a shift register comprising flip-flops 32, 33, 34, and 35. Parallel data information obtainable from 16 lines in the shift register is combined in an exclusive-OR relationship with the hexadecimal word 30F5 from a 16-bit synchronization sequence in exclusive-OR gates 8'. From the 16 bits at the output terminal of exclusive-OR gates 8' a downstream adder 8" derives the horizontal sum. The result is delayed in a delay stage 15, producing two simultaneous synchronization sequences at the input terminals A and B of adder 16. Available at the output terminal of adder 16 are 6-bit long data words, which are forwarded to the input terminals of comparator 19 and register 18. Comparator 19 tests in conjunction with register 18 as previously described herein to determine whether the word arriving from adder 16 is smaller than the word stored in register 18. At an initialization stage, register 18 is loaded with the binary value 111111. Comparator 19 resets counter 21, which is timed by timing signal CLK. If the counter is not reset between two sequences of synchronization words, it will emit a pulse in the form of a starting pulse that defines the chronological situation and hence the beginning of a recognized synchronization sequence in the serial data signal.

There has thus been shown and described a novel method of synchronizing digital data which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention, which is to be limited only by the claims which follow.

What is claimed is:

1. Method of synchronizing a digital data stream which contains a synchronization sequence at periodic intervals, whereby a bit-synchronous timing signal (CLK) is regenerated from the digital data stream and a signal ($B_{ST}$) is derived that characterizes the temporal position of a recognized synchronization sequence in the digital data stream, said method comprising the steps of comparing a sequence of bits in said digital data stream that form a trial synchronization sequence with an ideal bit sequence of said synchronization sequence to detect the number of bit errors of said trial synchronization sequence in relation to said ideal bit sequence; adding the detected value of said number of bit errors to the value of the number of bit errors previously detected for a trial synchronization sequence that is displaced at the periodic interval of said synchronization sequence in said digital data stream; temporarily storing the resulting sum in a buffer when it is lower than a sum previously deposited in the buffer, the time when the sum is temporarily stored dictating the temporal position of a pulse that characterizes the location of the trial synchronization sequence within the digital data stream and, subsequent to processing a number of data corresponding to said periodic interval in said digital data stream, leads to erasure of the buffer when no smaller sum has appeared; and delaying said digital data stream for equalization of signal periods by the processing procedure by twice the duration of said periodic interval.

2. Method of synchronizing data words in the serial-to-parallel conversion of a digital data signal separated into data blocks, each of which comprises a group of data words and synchronization words assigned to the group, wherein a bit-synchronous timing signal (CLK) is regenerated from the present data signal and a word-timing signal ($T_W$) is derived that has a frequency equaling the sequential frequency of the serial words, although it is not strictly assigned to them chronologically; wherein said word-timing signal is utilized to convert said data signal, which is present in serial form, initially into a parallel data signal as long as one word; wherein the data represented in the parallel data signal are temporarily stored in a buffer; wherein the number of bits periods that the originally established chronological relationship of converted data words deviates from an ideal value dictated by said synchronization words is detected; and wherein the originally established chronological relationship of converted data words is varied in accordance with the detected deviation by a corresponding read-out from said buffer; said method comprising the steps of comparing the bit sequence of the words in the parallel data signal with an ideal bit sequence of said synchronization words; detecting the number of bit errors in relation to said ideal bit sequence for every bit position in a word; and comparing the number of bit errors for every bit position in a word with the number of bit errors detected in the interval of one data block length to determine the bit position with the smallest bit error, such that every bit position that reveals the lowest bit error for the duration of one data block length dictates the chronological relationship of the serial-to-parallel converted data words in the parallel data signal.

3. The method defined in claim 2, wherein the bit sequence of the words in said parallel data signal is combined in an exclusive-OR relationship with said ideal bit sequence and wherein said resulting sum is constructed from a bit sequence derived by said exclusive-OR combination.

4. The method defined in claim 2, wherein an exclusive-OR relationship between the data words and the synchronization words is established for each bit position in a word, and wherein the particular horizontal sum is then determined.

5. The method defined in claim 3, wherein the value of the horizontal sum determined for each bit position in a word is clamped.

6. The method defined in claim 3, wherein the value of each horizontal sum is delayed the length of one data block and wherein both the undelayed and the delayed values of the horizontal sums associated with one bit position are added.

7. The method defined in claim 6, wherein the overflow is clamped during the addition of the undelayed and delayed horizontal sums.

8. The method defined in claim 2, further comprising a device for determining the bit position with the lowest bit error and a register for receiving the value of the lowest bit error.

9. The method defined in claim 8, wherein the value present in said register for one bit error is compared with the actual value of the lowest bit error present, and wherein, when the actual bit error is lower than the value stored in said register, the value contained in said register is replaced with the actual value of the lowest bit error present.

10. The method defined in claim 8, wherein the determination of values of the lowest bit error and of the associated bit position is accompanied by the resetting of a counter that is timed with the word-synchronous timing signal ($T_W$) and that, once a counter state that corresponds to the interval in data words between two double synchronization words has been attained, generates a charging pulse signal (LD) for a bit shifter that undertakes a corresponding correction of the bit position of the actual serial-to-parallel converted data signal in accordance with the value of the bit position.

11. The method defined in claim 8, wherein a block-start signal ($B_{ST}$) that indicates the beginning of the data block is generated parallel with the corrected data signal in the bit position.

12. The method defined in claim 10, wherein signal propagation times are compared during the data-processing procedure for the purpose of recognizing and valuating sequences of synchronization bits in the flow of the data signal by a delay stage between the input terminal of the bit shifter and the output terminal of serial-to-parallel converter.

* * * * *